United States Patent [19]
Irwin

[11] Patent Number: 5,999,017
[45] Date of Patent: Dec. 7, 1999

[54] CMOS IMPLEMENTED OUTPUT BUFFER CIRCUIT FOR PROVIDING ECL LEVEL SIGNALS

[75] Inventor: James S. Irwin, Paige, Tex.

[73] Assignee: Motorola, Inc., Schaumburg, Ill.

[21] Appl. No.: 08/887,827

[22] Filed: Jul. 3, 1997

[51] Int. Cl.$^6$ .................. H03K 19/175; H03K 19/094
[52] U.S. Cl. .................................................. 326/73; 326/68
[58] Field of Search ..................................... 326/73, 74, 68, 326/26, 27, 33, 34, 83, 86, 121

[56] References Cited

U.S. PATENT DOCUMENTS

| | | | |
|---|---|---|---|
| 4,384,220 | 5/1983 | Segawa et al. | 326/33 |
| 5,117,125 | 5/1992 | Mayes | 326/103 |
| 5,361,002 | 11/1994 | Casper | 326/68 |
| 5,376,843 | 12/1994 | Tien et al. | 326/68 |
| 5,428,303 | 6/1995 | Pasqualini | 326/27 |

Primary Examiner—Jon Santamauro
Assistant Examiner—Daniel D. Chang
Attorney, Agent, or Firm—Craig J. Yudell; Robert L. King

[57] ABSTRACT

A CMOS implemented output buffer (10) provides ECL level output signals. The output buffer (10) is implemented in two stages. The first stage (36) includes an inverter having a resistor (39) in series with a P-channel transistor (38) and an N-channel transistor (40) and provides the initial buffering. The resistor (39) in the first inverter stage (36) is used to reduce a cross-over current in the second drive stage (42). The second stage (42) provides additional drive capability and includes an integral level converter. The integral level converter is implemented as a P-channel transistor (44) connected in series with the P-channel and N-channel output driver transistors (53 and 55). The P-channel transistor (44) provides the level shifting function to ECL levels for the second stage. The bias level of the P-channel transistor (44) determines the output logic swing.

19 Claims, 1 Drawing Sheet

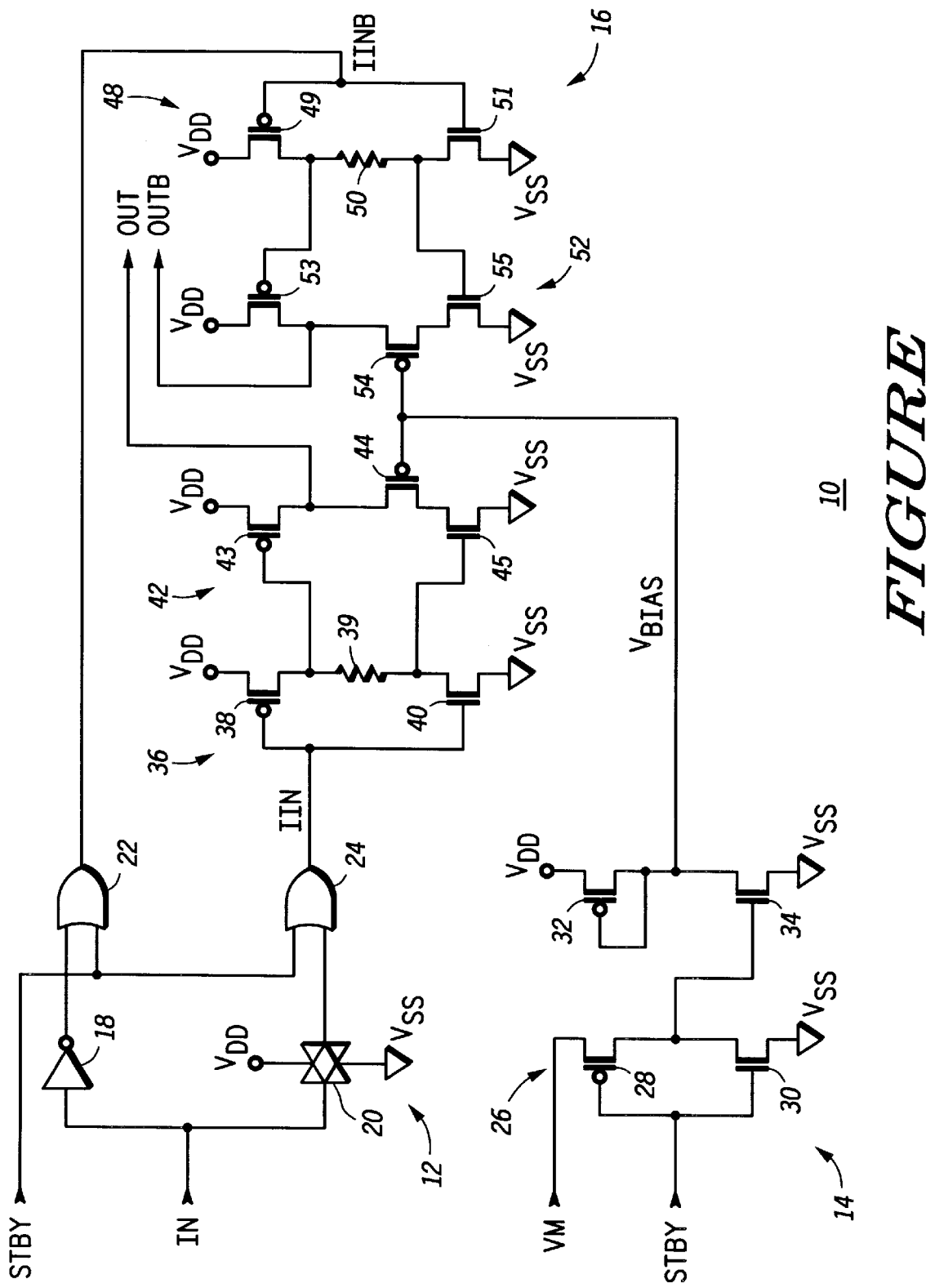

CMOS IMPLEMENTED OUTPUT BUFFER CIRCUIT FOR PROVIDING ECL LEVEL SIGNALS

FIELD OF THE INVENTION

This invention relates generally to integrated circuits, and more particularly, to a CMOS implemented output circuit for providing ECL level signals.

BACKGROUND OF THE INVENTION

In integrated circuit design, there are various types of logic available. For example, ECL (emitter-coupled logic) is a type of integrated circuit logic which traditionally uses bipolar transistors. CMOS is another type of integrated circuit logic, however CMOS uses complementary MOS-FET transistors. ECL circuits have the advantage of high speed, but they consume a large amount of power. CMOS logic circuits have the advantages of low power dissipation, high input resistance, low output resistance, and low noise generation. An ECL voltage swing is generally about one diode voltage drop from a logic high to a logic low, while CMOS logic levels may swing full rail. To achieve compatibility between two different logic families, a level conversion circuit converts, or translates, a logic signal from one logic level to another logic level. For example, a CMOS logic level may have to be converted to an ECL (emitter-coupled logic) level to allow one integrated circuit to communicate with another. A level conversion circuit is used to do the conversion. A level conversion circuit should not cause excessive delay or consume a large amount of power. Additional buffering and drive capability may be provided using an output driver circuit.

An ECL output driver generally consists of a differential pair of bipolar transistors having current electrodes coupled to a power supply via resistors and supplied by a common current source. The ECL output driver provides reduced voltage swing, allowing a reduction in average switching current. Also, ECL generally provides the advantages of good noise immunity because the signals are differential. In addition, ECL provides reduced switching current, and is relatively fast.

A problem with using an ECL output driver with a significant load capacitance is that as the load capacitance increases, the required bias current also increases. For a given rise time, the required bias current may be prohibitive for low power applications such as battery powered communications devices including pagers, two-way radios, etc. Therefore, it would be advantageous to provide an output buffer which provides the advantages of ECL with reduced bias current.

BRIEF DESCRIPTION OF THE DRAWING

The FIGURE illustrates a CMOS implemented ECL output buffer/level converter in accordance with a preferred embodiment of the present invention.

DESCRIPTION OF A PREFERRED EMBODIMENT

Generally, the present invention provides a CMOS implemented output buffer for providing ECL level output signals. The output buffer is implemented in two stages. The first stage includes an inverter having a resistor in series with the P-channel and N-channel transistor and provides the initial buffering. The second stage provides additional drive capability and includes an integral level converter. The second stage has a P-channel transistor connected in series, as a source follower, with the P-channel and N-channel output driver transistors. The P-channel transistor provides the level shifting function for the second stage. The P-channel transistor is biased to have a gate-to-source voltage ($V_{GS}$) of about 0.4 volt. The resistor in the first inverter stage is used to reduce a cross-over current in the second stage.

The CMOS implemented output buffer provides the advantages of ECL level output signals without requiring the large bias current of the prior art ECL differential amplifiers. In addition, the CMOS implemented output buffer still provides good noise immunity, reduced switching current, and high speed.

The FIGURE illustrates CMOS implemented ECL output buffer 10 in accordance with a preferred embodiment of the present invention. CMOS output buffer 10 includes input logic 12, bias voltage generator 14, and two-stage output buffer 16. Input logic 12 includes inverter 18, transmission gate 20 and OR logic gates 22 and 24. Bias voltage generator 14 includes inverter 26, diode-connected transistor 32, and N-channel transistor 34. Inverter 26 includes P-channel transistor 28 and N-channel transistor 30. Two-stage output buffer 16 includes first stages 36 and 48 and second stages 42 and 52. First stage 36 is a slew rate controlled inverter having P-channel transistor 38, resistor 39, and N-channel transistor 40. Likewise, first stage 48 is a slew rate controlled inverter having P-channel transistor 49, resistor 50 and N-channel transistor 51. Second stage 42 includes P-channel transistor 43, P-channel transistor 44 and N-channel transistor 45. Second stage 52 includes P-channel transistor 53, P-channel transistor 54, and N-channel transistor 55.

Inverter 18 has an input terminal for receiving an input data signal labeled "IN", and an output terminal. Transmission gate 20 has an input terminal for receiving input signal IN, and an output terminal. OR logic gate 22 has a first input terminal coupled to the output terminal of inverter 18, a second input terminal for receiving a standby signal labeled "STBY", and an output terminal for providing an intermediate signal labeled "IINB". OR logic gate 24 has a first input terminal for receiving standby signal STBY, a second input terminal coupled to the output terminal of transmission gate 20, and an output terminal for providing an intermediate signal labeled "IIN". Note that a signal name ending with "B" is a logical complement of a signal have the same name but lacking the "B".

In inverter 36, P-channel transistor 38 has a source connected to a power supply voltage terminal labeled $V_{DD}$, a gate coupled to the output terminal of OR logic gate 24, and a drain. Resistor 39 has a first terminal connected to the drain of P-channel transistor 38, and a second terminal. N-channel transistor 40 has a drain connected to the second terminal of resistor 39, a gate coupled to the output terminal of OR logic gate 24, and a source connected to a power supply voltage terminal labeled $V_{SS}$. P-channel transistor 43 has a source connected to $V_{DD}$, a gate connected to the drain of P-channel transistor 38, and a drain for providing an output signal labeled "OUT". P-channel transistor 44 has a source connected to the drain of P-channel transistor 43, a gate for receiving a bias voltage labeled "$V_{BIAS}$" and a drain. N-channel transistor 45 has a drain connected to the drain of P-channel transistor 44, a gate connected to the drain of N-channel transistor 40 and a source connected to $V_{SS}$.

P-channel transistor 53 has source connected to $V_{DD}$, a gate, and a drain for providing an output signal labeled OUTB. P-channel transistor 54 has a source connected to the drain of P-channel transistor 53, a gate for receiving bias voltage $V_{BIAS}$, and a drain. N-channel transistor 55 has a drain connected to the drain of P-channel transistor 54, a gate, and a source connected to $V_{SS}$. P-channel transistor 49 has a source connected to $V_{DD}$, a gate for receiving intermediate input signal IINB, and a drain connected to the gate of P-channel transistor 53. Resistor 50 has a first terminal connected to the drain of P-channel transistor 49, and a second terminal. N-channel transistor 51 has a drain connected to the second terminal of resistor 50 and the gate of N-channel transistor 55, a gate for receiving intermediate input signal IINB, and a source connected to $V_{SS}$. P-channel transistor 28 has a source for receiving a mirror voltage labeled "VM", a gate for receiving standby signal STBY and a drain. N-channel transistor 30 has a drain connected to the drain of P-channel transistor 28, a gate for receiving standby signal STBY and a source connected to $V_{SS}$. Diode connected P-channel transistor 32 has a source connected to $V_{DD}$, and a gate connected to its drain for providing bias voltage $V_{BIAS}$. N-channel transistor 34 has a drain connected to the drain of P-channel transistor 32, a gate connected to the drain of P-channel transistor 28, and a source connected to $V_{SS}$.

In operation, CMOS output buffer 10 receives single-ended input signal IN at a CMOS logic level, and provides differential output signals OUT/OUTB at ECL levels. Input logic 12 converts single-ended input signal IN to CMOS level differential intermediate signals IIN and IINB, which are provided to first stage 36 and first stage 48, respectively. Transmission gate 20 is included in input logic 12 to match a gate delay of inverter 18 such that the output terminals of OR logic gates 22 and 24 switch in response to the input signal at about the same time.

In two stage output buffer 16, first stages 36 and 48 provide initial buffering to step up the drive level of the signals provided to second stages 42 and 52. In a preferred embodiment, resistor 39 is included in inverter 36 in order to reduce a cross-over current in output stage 42. A cross-over current occurs when, for example, P-channel transistor 43 and N-channel transistor 45 are conductive at the same time. They may be conductive at the same time when input signal IN is transitioning from one logic level to another, and one transistor becomes conductive before the other transistor can turn off.

By way of example, resistor 39 reduces cross-over current by allowing N-channel transistor 45 to switch off before P-channel transistor 43 switches on in the case when intermediate input signal IIN is transitioning from a logic low to a logic high. In other embodiments, resistor 39 may be replaced by a short circuit. P-channel transistors 44 and 54 are source-follower transistors. They provide the level shifting from CMOS levels to ECL levels in the second stages of output buffer 10. P-channel transistors 44 and 54 maintain output voltages OUT and OUTB one threshold voltage drop above bias voltage $V_{BIAS}$.

When an integrated circuit having output buffer 10 is in a standby, or power down mode, control signal STBY is asserted as a logic high. When control signal STBY is a logic high, inverter 26 provides a logic low to the gate of N-channel transistor 34, causing N-channel transistor 34 to be substantially non-conductive. Bias signal $V_{BIAS}$ is high, causing both of P-channel transistors 44 and 54 to be non-conductive. Also, OR logic gates 22 and 24 provide logic highs to the input terminals of inverters 42 and 48, causing P-channel transistors 43 and 53 to be conductive. Output signals OUT and OUTB are provided as logic highs.

As an example of the level conversion operation of output buffer 10, consider the case when intermediate input signal IIN is a CMOS logic high, and intermediate input signal IINB is a CMOS logic low. P-channel transistor 43 will be conductive and N-channel transistor 45 will be substantially non-conductive. Output signal OUT will then be pulled to about $V_{DD}$. Likewise, intermediate input signal IINB will be a CMOS logic low. P-channel transistor 53 will be non-conductive and N-channel transistor 55 will be conductive. Output signal OUTB will be reduced to about a threshold voltage drop ($V_T$) above bias voltage $V_{BIAS}$. Bias voltage $V_{BIAS}$ is chosen such that output signals OUT and OUTB are at approximately ECL logic levels.

P-channel transistors 44 and 54 are relatively large and have relatively high transconductance to provide a strong voltage sourcing capability. Diode-connected P-channel transistor 32 is chosen to be relatively smaller and has a lower transconductance to provide bias voltage $V_{BIAS}$ as a function of the current through N-channel transistor 34. Inverter 26 receives mirror voltage VM and provides a voltage to the gate of N-channel transistor 34 such that N-channel transistor 34 provides a current sink for diode-connected P-channel transistor 32.

Output buffer 10 is relatively insensitive to process and temperature variations because diode-connected transistor 32 and transistors 44 and 54 are the same conductivity type. The voltage swing of output signals OUT and OUTB is controlled by adjusting the voltage of bias voltage $V_{BIAS}$ and the size ratio of diode-connected transistor 32 to P-channel transistors 44 and 54. A voltage drop across P-channel transistor 32 is chosen such that it is equal to the logic swing of OUT and OUTB plus the threshold voltage of P-channel transistors 44 and 54.

Because output buffer 10 is implemented in CMOS, current drain is much lower than in an ECL output buffer implemented with bipolar transistors as a differential amplifier. Current drain is lower because, in output buffer 10, unlike the differential amplifier, the load transistors (reference numbers 43 and 53) are switched off during steady state, eliminating current flow during steady state. The only steady state current in output buffer 10 is a current through transistors 32 and 34 for providing bias voltage $V_{BIAS}$. However, the current through P-channel transistor 32 and N-channel transistor 34 can be made arbitrarily small by appropriately sizing transistors 32 and 34.

While the invention has been described in the context of a preferred embodiment, it will be apparent to those skilled in the art that the present invention may be modified in numerous ways and may assume many embodiments other than that specifically set out and described above. For example, output buffer 10 provides ECL level signals. In other embodiments, the output signal swing may be any level smaller than full rail. Accordingly, it is intended by the appended claims to cover all modifications of the invention which fall within the true spirit and scope of the invention.

What is claimed is:

1. An output buffer comprising:
    an output inverter having a first transistor, a second transistor and a third transistor connected in series, the first transistor having a supply terminal for receiving a first supply voltage and an output terminal, the second transistor having a first terminal connected to the output terminal of the first transistor, a second terminal connected to a first terminal of the third transistor and a control terminal for receiving a bias voltage, and wherein the first and third transistors are complementary and each have a control terminal for receiving an input signal;

a first bias circuit including a first device having a supply terminal receiving the first supply voltage and an output terminal providing the bias voltage, and a second device connected between the output terminal of the first device and a second supply voltage; and a second bias circuit having a fourth and a fifth transistor coupled in series via a resistor, the control terminal of the first transistor being connected to a first terminal of the resistor, and the control terminal of the second transistor being connected to a second terminal of the resistor, the fourth and fifth transistors being complementary, the resistor reducing a possibility of the first and third transistors from being conductive at the same time and thereby reducing cross-over current.

2. The output buffer of claim 1, wherein the transistors are CMOS transistors.

3. The output buffer of claim 1, wherein the first device is a diode device.

4. The output buffer of claim 1, wherein the second device is a current source device.

5. The output buffer of claim 1, wherein the first and second transistors are PMOS transistors.

6. The output buffer of claim 1, wherein the output terminal of the first transistor outputs an output signal that swings between the first supply voltage and approximately the bias voltage, wherein the bias voltage is between the first supply voltage and the second supply voltage.

7. The output buffer of claim 1, further wherein the first device has the same process and temperature dependencies as the second transistor such that the bias voltage provided compensates an output signal of the first terminal of the second transistor to produce a substantially independent process and temperature output swing of the output signal.

8. An output buffer comprising:

a first stage inverter including a resistor having a first terminal and a second terminal connected in series between a complementary pair of transistors, wherein the first stage inverter outputs the inverse of an input signal, which is received at control terminals of the complementary transistors, at the first and second terminals; and a second stage for providing a reduced swing output, the second stage having a first transistor, a second transistor and a third transistor connected in series, the first transistor having a voltage terminal for receiving a first voltage, a control terminal connected to the first terminal of the resistor and an output terminal, the second transistor being connected between the output terminal of the first transistor and an output terminal of the third transistor and having a control terminal for receiving a bias voltage, and the third transistor having a control terminal connected to the second terminal of the resistor and a voltage terminal for receiving a second voltage, wherein the first and third transistors are complementary;

wherein the second stage produces an output at the output terminal of the first transistor at or between the first voltage and an intermediate level voltage that is between the first voltage and the second voltage.

9. The output buffer of claim 8, wherein the second transistor has a transconductance greater than the third transistor to provide a fast switching speed.

10. The output buffer of claim 8, wherein the transistors are CMOS transistors.

11. The output buffer of claim 8, wherein the first and second transistors are PMOS transistors.

12. The output buffer of claim 8, wherein the first stage delays an output signal received at the first terminal of the resistor relative to the output signal received at the second terminal of the resistor such that the first and second transistors are not switched simultaneously.

13. The output buffer of claim 8, further comprising:

a third stage inverter including a resistor having a first terminal and a second terminal connected in series between a complementary pair of transistors, wherein the third stage inverter outputs the input signal at the first and second terminals; and a fourth stage for providing a reduced swing output, the second stage having a first transistor, a second transistor and a third transistor connected in series, the first transistor having a voltage terminal for receiving the first voltage, a control terminal connected to the first terminal of the resistor and an output terminal, the second transistor being connected between the output terminal of the first transistor and an output terminal of the third transistor and having a control terminal for receiving the bias voltage, and the third transistor having a control terminal connected to the second terminal of the resistor and a voltage terminal for receiving the second voltage, wherein the first and third transistors are complementary;

wherein the fourth stage produces an output at the output terminal of the first transistor of the fourth stage at or between the first voltage and an intermediate level voltage that is between the first voltage and the second voltage.

14. The output buffer of claim 13, further comprising standby circuitry for placing the output of the second stage and the output of the fourth stage at substantially the same voltage level.

15. The output buffer of claim 8, further comprising a bias circuit including a first device having a supply terminal for receiving the first voltage and an output terminal that provides the bias voltage and a second device connected between the output terminal of the first device and the second voltage.

16. An output buffer comprising:

a first inverter having a first terminal for receiving a first voltage, a second terminal for receiving a second voltage, and an input terminal for receiving an input signal, wherein the inverter includes a source follower having an output terminal for generating an output signal and a control terminal for receiving a bias voltage, and wherein the bias voltage is between the first voltage and second voltage;

wherein an input signal at the input terminal of the first interter is inverted and level shifted at the output terminal of the source follower such that the output signal swings between the first voltage and to within a threshold voltage of the bias voltage;

a second inverter having a first terminal for receiving the first voltage, a second terminal for receiving the second voltage, and an input terminal for receiving an inverse of the input signal, wherein the second inverter including a source follower having, an output terminal for generating an output signal and a control terminal for receiving the bias voltage;

wherein the inverse of the input signal at the input terminal of the second inverter is inverted and level shifted at the output terminal of the source follower of the second inverter such that the output signal swings between the first voltage and to within a threshold voltage of the bias voltage, wherein the output signal of the source follower of the second inverter and the output signal of the source follower of the first inverter together provide a differential output signal.

17. The output buffer of claim 16, further comprising a bias circuit that generates the bias voltage including a device having the same process and temperature dependencies as the source follower such that the bias voltage generated compensates the output signal of the source follower to produce a substantially independent process and temperature output swing of the output signal.

18. The output buffer of claim 16, wherein the inverter is a CMOS device.

19. The output buffer of claim 16, further comprising standby circuitry for placing the output signal of the source follower of the second inverter and the output signal of the source follower of the first inverter at substantially the same voltage level.

* * * * *